United States Patent [19]
Sako et al.

[11] Patent Number: 4,964,128
[45] Date of Patent: Oct. 16, 1990

[54] DATA TRANSMISSION METHOD FOR INTERLEAVED DATA

[75] Inventors: Yoichiro Sako, Chiba; Hiroshi Ogawa, Kanagawa, both of Japan

[73] Assignee: Sony Corporation, Tokyo, Japan

[21] Appl. No.: 250,516

[22] Filed: Sep. 29, 1988

[30] Foreign Application Priority Data

Sep. 29, 1987 [JP] Japan .................. 62-244996

[51] Int. Cl.⁵ .................................. G06F 11/10
[52] U.S. Cl. ........................ 371/39.1; 371/37.5; 371/50.1
[58] Field of Search ............ 371/37.1, 37.2, 37.4, 371/37.5, 37.6, 37.7, 38.1, 39.1, 50.1

[56] References Cited

U.S. PATENT DOCUMENTS

| | | | |
|---|---|---|---|
| 4,435,807 | 3/1984 | Scott | 371/50.1 |
| 4,546,474 | 10/1985 | Sako | 371/37.5 |
| 4,649,542 | 3/1987 | Nishimura | 371/37.5 |
| 4,677,622 | 6/1987 | Okamoto | 371/37.5 |
| 4,707,805 | 11/1987 | Narusawa | 371/37.5 |
| 4,716,567 | 12/1987 | Ito | 371/50.1 |
| 4,764,927 | 8/1988 | Izumita | 371/50.1 |
| 4,785,451 | 11/1988 | Sako | 371/37.5 |
| 4,785,452 | 11/1988 | Petz | 371/37.5 |

Primary Examiner—Michael R. Fleming
Attorney, Agent, or Firm—Hill, Van Santen, Steadman & Simpson

[57] ABSTRACT

In a method for transmitting interleaved data, when the respective data blocks to be transmitted are interleaved and augmented by the error correcting parity codes before being transmitted on the transmission channel, a prescribed number of dummy data are provided between the respective data blocks so that the data block and the neighboring data blocks are not in the interleaving relation. In this matter, data addition, correction and substitution can be made easily for each data block or a group of blocks without influencing the error correction parity codes of the remaining block data.

11 Claims, 7 Drawing Sheets

DATA TRANSMISSION METHOD FOR INTERLEAVED DATA

BACKGROUND OF THE INVENTION

1. Field of the Invention

This invention relates to a data transmission method for interleaved data that may be used for a data recording/reproducing system or a packet communication system wherein interleaved data are transmitted on the transmission channel in conformity with the data format pursuant to, for example, the prescriptions for a compact disk (CD).

2. Description of the Prior Art

Digital/audio disks for music, in which digital/audio data are recorded on the optical disk as the recording medium, such as compact disks or CDs, have become popular. In the CDs for music, a dual coding system employing two series of Reed Solomon codes is adopted as the error correction code system. The data blocks obtained upon digitizing the original audio signals, dividing the resulting digital audio data into groups each consisting of a prescribed number of data and arraying each group of the data two-dimensionally are subjected to an interleaving operation. For example, as shown in FIG. 1, parity codes P are found for data strings of the respective rows of a data block consisting of block data $S_1, S_2, \ldots, S_{27}$ to form a second Reed Solomon code series $C_2$. The data of the respective rows, now added to by the parity codes P making up the second Reed Solomon codes $C_2$ are then subjected to an interleaving operation. In this case, parity codes Q are found for the respective obliquely extending data strings of the two-dimensionally arranged data blocks to form a first Reed Solomon code series $C_1$. In this manner, cross interleaved Reed-Solomon code or CIRC is formed and transmitted to render the signal processing having high error correction capability possible to provide high-quality reproduced audio signals.

There is also standardized a CD-read only memory or CD-ROM having disk specifications, recording format, modulation system and the error-detection/correction system, in common with the CD for music, and in which the code information is adapted to be written into a data region in which the music information in the CD for music is arrayed. In the CD system for music, data are processed with one frame composed of 588 channel bits as one unit. In the CD-ROM, data are processed with 98 frames as one unit or sector and with the sector addresses introduced into a control signal portion or user bits at the beginning portion of each frame.

The above described CDs for music and CD-ROMS are play-only optical disk on which data are prerecorded once and for all at the supplier side. There is also evolved and utilized a direct read after write (DRAW) type optical disk on which data can be written at the user side, or an opto-magnetic disk on which both data recording and reproduction are feasible at the user side.

In FIG. 2, the relation between the sector array of the CD-ROM having the disk format conforming to the standards for CDs for music and the array of the interleaved block data is shown schematically. In this figure, unit recording regions or sectors $SC_n$ are indicated by broken lines. To these sectors $SC_n$ are affixed two series of Reed Solomon Codes $C_1$ and $C_2$ to data blocks $DB_n$ which are then coded by interleaving so as to lie across three sectors $SC_n$, $SC_{n+1}$ and $SC_{n+2}$ as indicated by hatched lines in the figure. Thus, although interleaved data are arrayed in the respective sectors formed on the disk, the data block $DB_n$ is subjected to interleaving so that the data block is arrayed so as to lie across the plural sectors $SC_n$, $SC_{n+1}$ and $SC_{n+2}$. In FIG. 2, the data disposed in each sector are divided at intervals of 32 words and arrayed two-dimensionally for illustrating the relation between the sector construction and the interleaved data block. Hence, in the above embodiment, data of the data blocks $DB_n$ cannot be read completely unless the three sectors $SC_n$, $SC_{n+1}$ and $SC_{n+2}$ are reproduced. Therefore, when the CD write once read many memory (CD-WORM) or the CD random access memory (CD-RAM) for music having superior compatibility with CD for music or CD-ROM is to be implemented using the DRAW type optical disk or opto-magnetic disk, writing or reading data arrayed in one sector $SC_n$ shown by hatched lines in FIG. 2 influences the Reed Solomon codes $C_1$ arrayed in the next following sector $SC_{n+1}$ and $SC_{n+2}$, because of the preceding interleaving operation, so that it becomes necessary to perform a highly complex operation to eliminate the influence in the next following sectors.

SUMMARY OF THE INVENTION

It is a principal object of the present invention to provide a data transmission method in which data blocks to be transmitted, such as data formats conforming to the standards for CDs for music, are subjected to interleaving, and error correction parity codes are generated and affixed to the interleaved data before sequential transmission, wherein data correction can be easily performed for each data block to be transmitted, that is, for each data file, in such a manner as to implement a data procession system wherein data can be post-written or re-written with the use of a CD-WORM or CD-RAM having compatibility with the CD or CD-ROM for music format, as the recording medium.

For accomplishing the above object, the present invention provides a data transmission method in which data to be transmitted are divided into groups each consisting of a prescribed number of data and are arrayed two-dimensionally, the obliquely extending direction, for example, of the two-dimensionally arrayed data is used as the direction along which the input data are arrayed, data are outputted in series in a direction different from the input data arraying direction, the outputted series data are subjected to interleaving, and the error correction parity codes are generated and affixed to the interleaved data for serial and sequential transmission, wherein according to the invention, dummy data are arrayed before and after the data blocks to be transmitted and the error correction parity codes are generated from the data forming the data blocks and the dummy data, the resulting data with the affixed error correction parity codes being then transmitted on the transmission channel.

According to the data transmission method of the present invention, dummy data composed of data having a prescribed pattern and arrayed before and after the data block to be transmitted are affixed to the data block to generate error correction parity codes, so that the parity codes for the transmitted data block do not affect the other neighboring data blocks. Data that do not affect the error correction parity codes, such as "0", are used as the dummy data of the prescribed pattern dummy data, so that no adverse effects are made on the previously transmitted data blocks or the data blocks to be transmitted next.

More precisely, in the data transmission method of the present invention in which data blocks to be transmitted are subject to interleaving and the error correction parity codes are generated and affixed to the interleaved data for transmission on the transmission channel, data blocks formed by the prescribed pattern data as the dummy data are arrayed before and after the data block composed of transmitted data, whereby the generated and affixed error correction parity codes for the transmitted data are not influenced by the addition or changes of the other transmitted data. Also, since the data of the prescribed pattern that do not influence the parity codes, such as "0", are used as the dummy data, the error correction parity codes that are generated and affixed to the previously transmitted data block or subsequently transmitted data block are not influenced so that data correction may be performed easily for each data file or data block formed by the transmitted data. In this manner, it becomes possible to implement a data processing system employing a CD-RAM or CD-WORM having compatibility with the CD-ROM or CD music format, as the recording medium.

DESCRIPTION OF THE PREFERRED EMBODIMENT

Figures 1, 2:
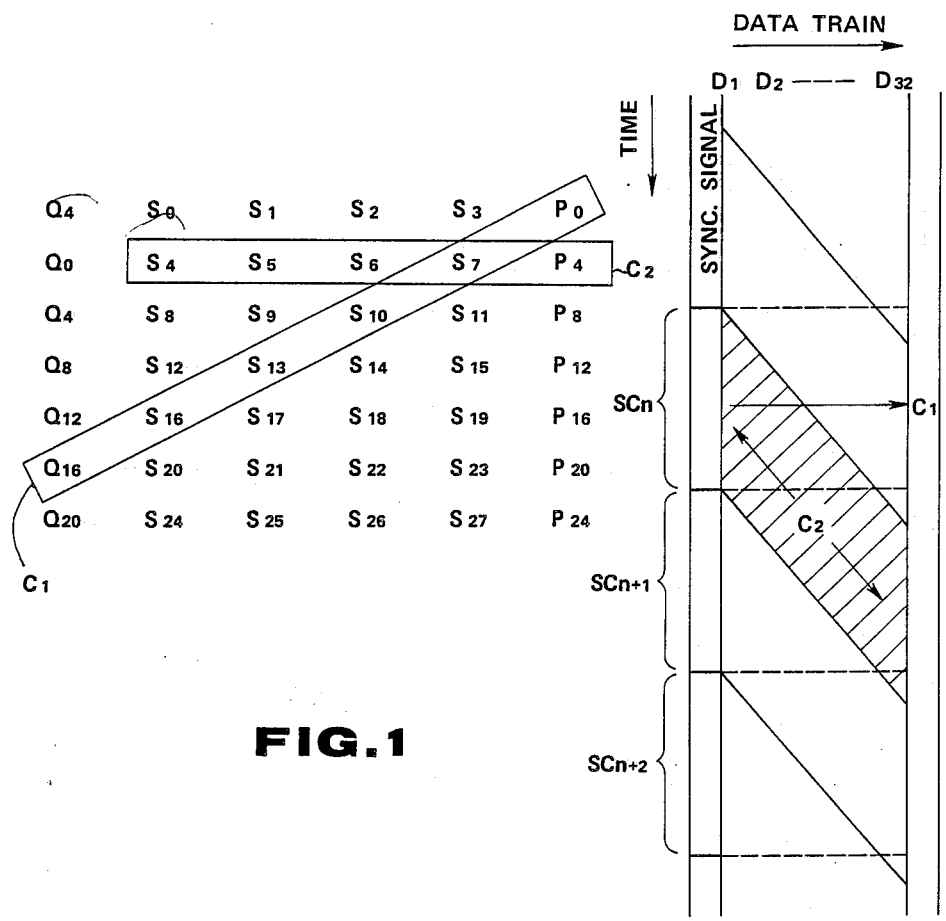
FIG. 1 is a diagrammatic view for illustrating the cross-interleave Reed Solomon code employed in the CD-format.
FIG. 2 is a diagrammatic view showing the general recording state by the CD-format as two-dimensional data.

A data transmission method by an opto-magnetic disk pursuant to the CD standard according to the present invention will be explained by referring to the drawings.

Figure 3:
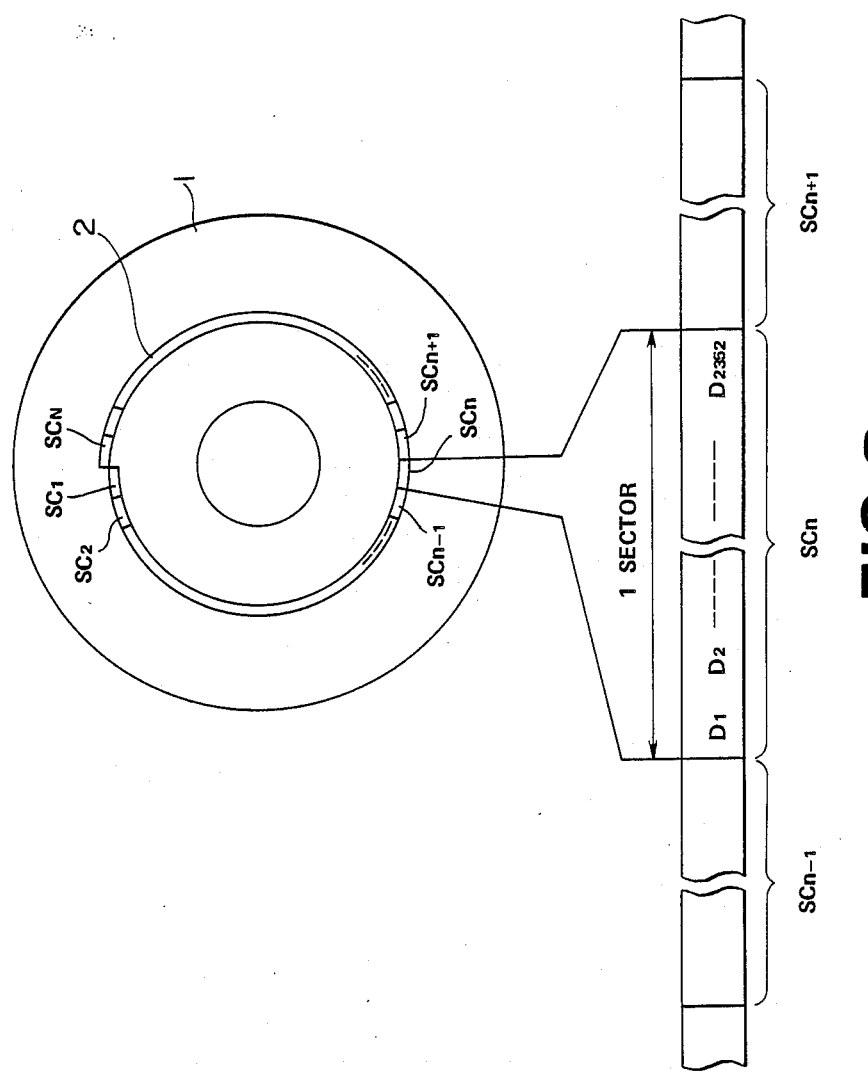
FIG. 3 is a diagrammatic view showing the disk format for the CD-RAM.

In the present embodiment, a spirally extending track 2 is formed on the opto-magnetic disk 1, as shown schematically in FIG. 3, and is divided along the circumferential direction thereof into a plurality of equiangular unit recording regions or sectors $SC_1$, $SC_2$, In each of these sectors, 12 bytes are allotted to sync signals, 4 bytes are allotted to the header, 2048 bytes are allotted to the user data and 288 bytes are allotted to the system data such as error correction codes, there are formed data each data unit of which is comprises of 98 frames or 2352 bytes in the CD format.

Figure 4:
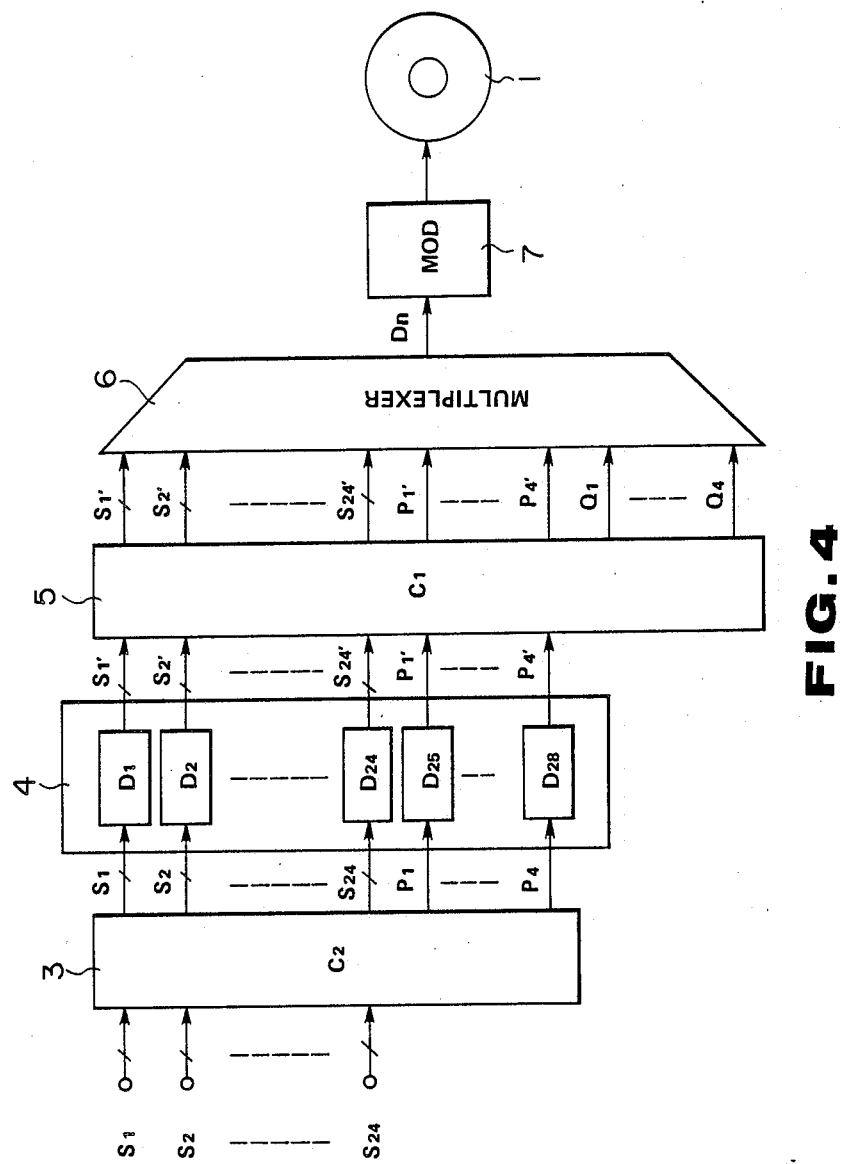
FIG. 4 is a block diagram showing the construction of the recording system for the CD-RAM.

In the recording section of the recording/reproducing system employing the opto-magnetic disk 1, as shown in the block diagram of FIG. 4, the header and user data are sequentially entered into a first Reed Solomon encoder 3 as parallel data $S_1$, $S_2$, ..., $S_{24}$ of one frame or 24 byes in the CD format. By this first Reed Solomon encoder 3, parity codes $P_1$, $P_2$, $P_3$ and $P_4$ are found for each group of 24 bytes to form a Reed Solomon code series $C_2$. The 28-byte parallel data $S_1$, $S_2$, ..., $S_{24}$, $P_1$, $P_2$, $P_3$ and $P_4$, composed of the parallel data $S_1$, $S_2$, ..., $S_{24}$ and the parity codes $P_1$, $P_2$, $P_3$ and $P_4$, are entered by way of an interleaving circuit 4 into a second Reed Solomon encoder 5. $D_1$, $D_2$, ..., $D_{28}$ denote delay circuits. By the second Reed Solomon encoder 5, parity codes $Q_1$, $Q_2$, $Q_3$ and $Q_4$ are found for each group of 28 bytes for the 28-byte parallel data $S_1'$, $S_2'$, ..., $S_{24}'$, $P_1'$, $P_2'$, $P_3'$ and $P_4'$ previously interleaved at the interleaving circuit 4, for forming Reed Solomon code series $C_1$. The 32-byte parallel data $S_1'$, $S_2'$, ..., $S_{24}'$, $P_1'$, $P_2'$, $P_3'$, $P_4'$, $Q_1$, $Q_2$, $Q_3$, $Q_4$, obtained upon affixing the parity codes $Q_1$, $Q_2$, $Q_3$ and $Q_4$ to the parallel data $S_1'$, $S_2'$, ..., $S_{24}'$, $P_1'$, $P_2'$, $P_3'$ and $P_4'$, are converted by a multiplexer 6 into series data $D_n$ so as to be recorded via modulator 7 on an opto-magnetic disk 1.

Figure 5:
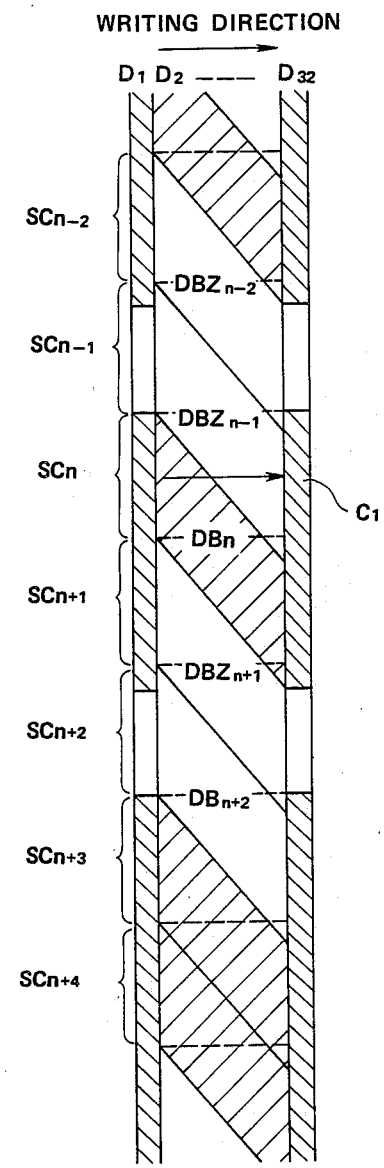
FIG. 5 is a diagrammatic view showing, as two-dimensional data, the recording state of the CD-RAM to which the present method is applied.

The user recorded on the opto-magnetic disk 1 by a recording system employing the aforementioned cross-interleaved Reed Solomon code or CIRC are shown schematically in FIG. 5, wherein the contents recorded in each of the sectors $SC_1$, $SC_2$, ..., $SC_n$ are arranged as two dimensionally arrayed data. By the aforementioned interleaving operation, a unit data block DB formed by, for example, one-sector data formed in turn upon affixing the above described two series of the Reed Solomon codes $C_1$ and $C_2$ to each of the sectors $SC_1$, $SC_2$, ..., $SC_n$ shown as being divided by broken lines in FIG. 5, are coded and recorded so as to lie across three sectors $SC_n$, $SC_{n+1}$ and $SC_{n+2}$, for example, as indicated by hatched lines in FIG. 5.

According to the present invention, in order that the interleaving operation has no effect on other data blocks, any of the three techniques are used when recording the data block $DB_n$.

Figure 6:
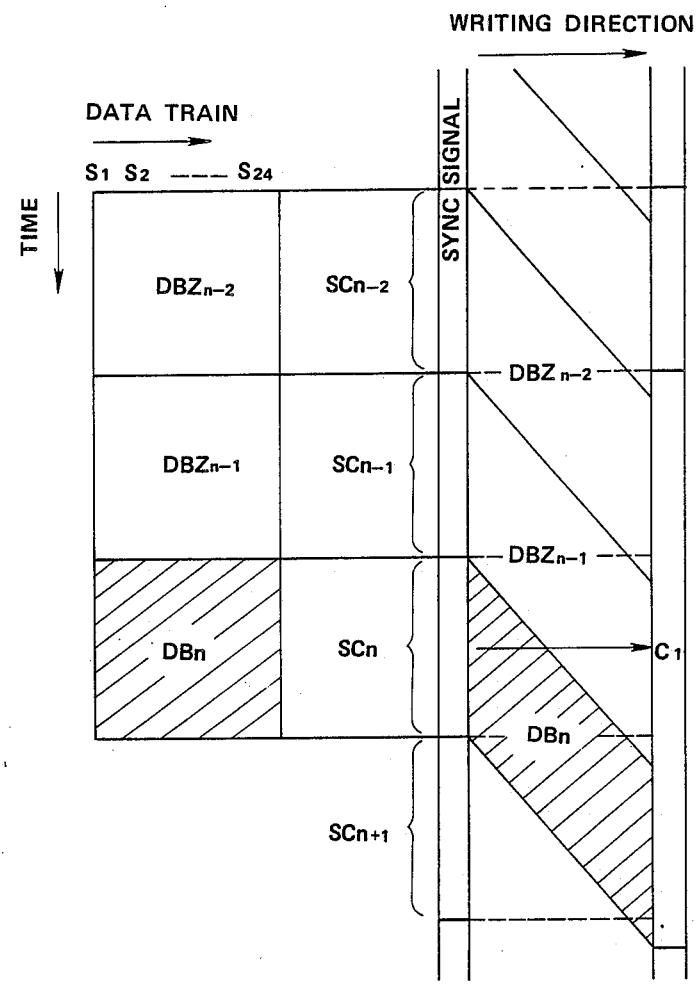
FIGS. 6, 7 and 8 are diagrammatic views for illustrating various types of data recording according to the method of the present invention.

(a) As shown in FIG. 6, before recording the data block $DB_n$, data blocks $DBZ_{n-1}$ and $DBZ_{n-2}$, each formed by prescribed data "0" as dummy data, are recorded.

Figure 7:
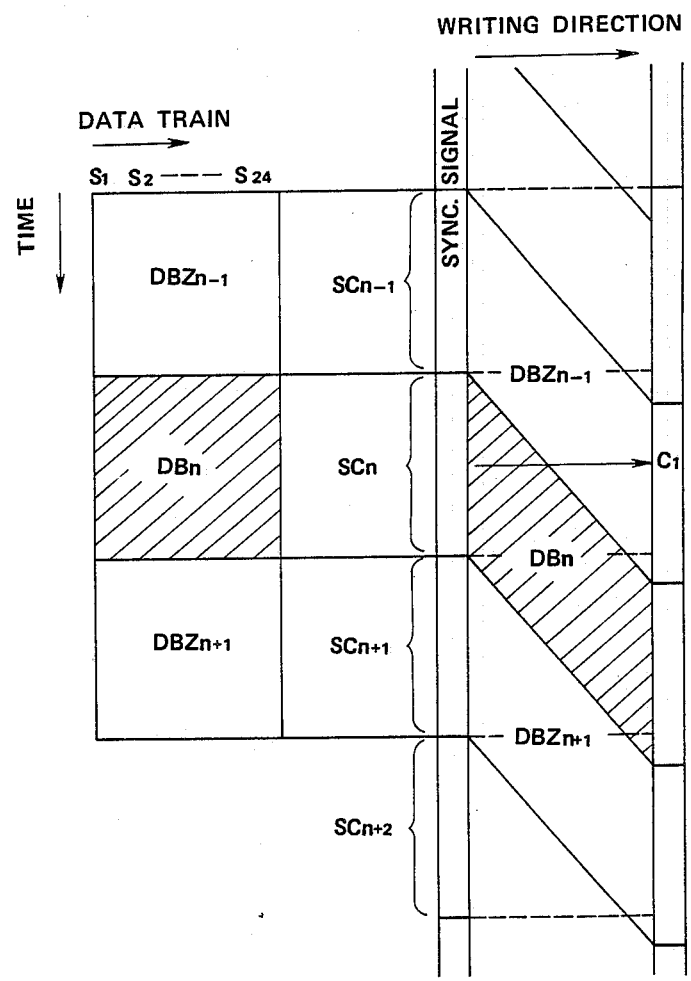

(b) As shown in FIG. 7, before recording the data block $DB_n$, a data block $DBZ_{n-1}$ formed by prescribed data "0" as the dummy data is recorded. After recording the data block $DB_n$, a data block $DBZ_{n+1}$, formed by prescribed data "0" as the dummy data is recorded.

Figure 8:
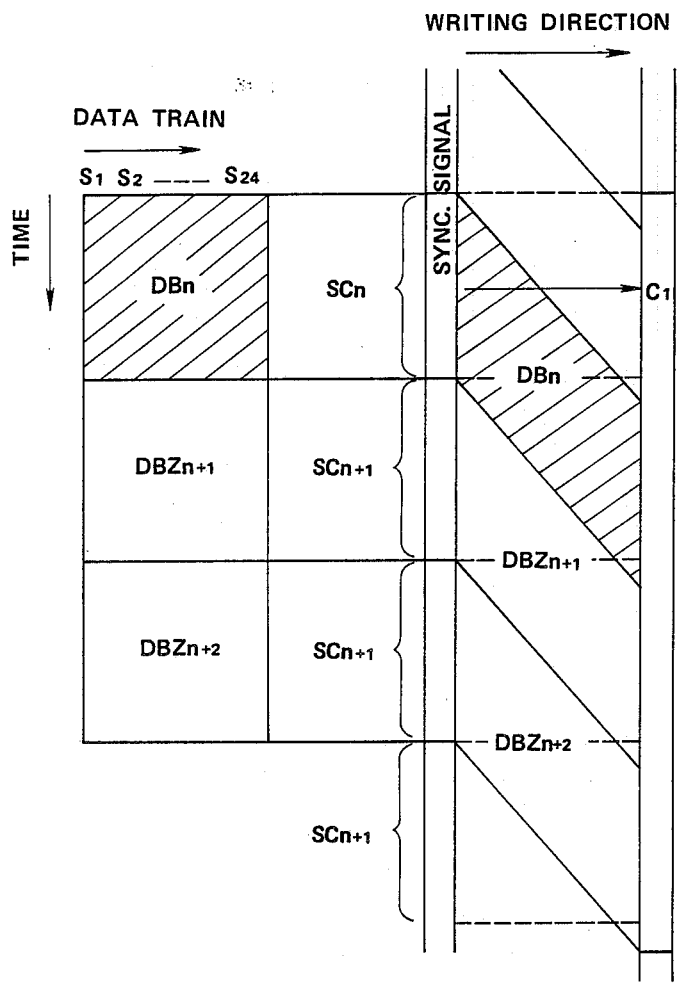

(c) As shown in FIG. 8, after recording the data block $DB_n$, data blocks $DBZ_{n+1}$ and $DB_{n+2}$, each formed by prescribed data "0" as the dummy data, are recorded.

By using any one of the techniques (a), (b) and (c), the two data blocks $DBZ_{n-2}$ and $DBZ_{n-1}$, $DBZ_{n+1}$ and $DB_{n+2}$, each being of, for example, a two data block length and formed by prescribed data "0" as the dummy data, are arrayed between the data block $DB_n$ formed by the user data and data blocks $DB_{n-1}$ and $DB_{n+1}$ placed just ahead and back of the data block $DB_n$, these data blocks $DB_{n-1}$ and $DB+1$ being formed by other user data. In this manner, data changes in the data block $DB_n$ does not affect the parity codes Q of the data blocks $DB_{n-1}$ and $DB_{n+1}$ before and after the data block $DB_n$. Therefore, the opto-magnetic disk 1, for example, on which for data rewriting and editing bY units of the desired data blocks $DB_n$, that is, for each data block or a group of data blocks.

The present method is not limited to a CD-RAM employing the opto-magnetic disk 1 as in the present embodiment, but may also be applied to a CD-WORM employing a DRAW type optical disk, packet communication pursuant to the CD-format, or to data transmission employing a data format other than the CD-format.

It will be apparent that various modifications and/or additions may be made in the apparatus of the invention without departing from the essential feature of novelty involved, which are intended to be defined and secured by the appended claims.

What is claimed is:

1. A data block transmission method for interleaved data comprising the steps of:
   scrambling input data elements forming each data block in the temporal order thereof by an interleaving operation to form interleaved input data elements,
   dividing said interleaved input data elements into groups, each group being composed of a prescribed number of said data elements,
   generating error correction parity codes and affixing said error correction parity codes to a prescribed number of data elements for transmission on a transmission channel, and
   using a prescribed number of dummy data elements arrayed with the input data elements forming said data blocks for generating and affixing the error correction parity codes.

2. The method according to claim 1, including the step of arraying said dummy data elements to compensate for the deficiency of the input data arrayed with said prescribed number of data elements for generating and affixing at least said error correction parity codes.

3. The method according to claim 1, including the step of setting said dummy data to the "0" logic level.

4. The method according to claim 1, including the step of arraying data elements at the leading portion of input data forming the data block.

5. The method according to claim 1, including the step of arraying said dummy data elements at the tailing portion of input data forming the data block.

6. The method according to claim 1, including the step of arraying said dummy data elements at the leading and tailing portions of input data forming the data block.

7. A data transmission method comprising the steps of:
   dividing a plurality of input data elements forming a data block into groups, each group being composed of a prescribed number of data elements,
   arraying said prescribed number of input data elements two-dimensionally,
   generating error correction parity codes from said input data elements and affixing said error correction parity codes to the predetermined number of data elements of the two-dimensionally arrayed data,
   arraying said error correction parity codes in a direction different from the arraying direction of the input data elements,
   sequentially transmitting said input data elements along said different direction, and
   arranging dummy data elements with said input data elements to compensate for the deficiency of the input data elements arrayed in said different direction to generate and affix the error correction parity codes.

8. The method according to claim 7, including the step of setting the dummy data to the "0" logic level.

9. The method according to claim 7, including the step of arraying said dummy data elements at the leading portion of the input data elements forming the data block.

10. The method according to claim 7, including the step of arraying said dummy data elements at the trailing portions of the input data elements forming the data block.

11. The method according to claim 7, including the step of arraying said dummy data elements at the leading and trailing portions of input data elements forming the data block.

* * * * *